(12) United States Patent
Lee

(10) Patent No.: US 7,917,825 B2
(45) Date of Patent: Mar. 29, 2011

(54) METHOD AND APPARATUS FOR SELECTIVELY UTILIZING INFORMATION WITHIN A SEMICONDUCTOR DEVICE

(76) Inventor: Joo-Sang Lee, Cary, NC (US)

( * ) Notice: Subject to any disclaimer, the term of this patent is extended or adjusted under 35 U.S.C. 154(b) by 1138 days.

(21) Appl. No.: 11/639,161

(22) Filed: Dec. 15, 2006

(65) Prior Publication Data

US 2008/0148007 A1 Jun. 19, 2008

(51) Int. Cl.
*G01R 31/28* (2006.01)

(52) U.S. Cl. ........ 714/738; 714/724; 714/731; 714/718; 714/728; 714/739; 365/201

(58) Field of Classification Search .................. None
See application file for complete search history.

(56) References Cited

U.S. PATENT DOCUMENTS

| | | | |
|---|---|---|---|
| 4,564,926 A | | 1/1986 | Nikaido et al. |
| 5,301,156 A | * | 4/1994 | Talley .......................... 365/201 |
| 6,019,501 A | | 2/2000 | Okazaki |
| 6,202,180 B1 | * | 3/2001 | Nose .............................. 714/718 |
| 6,822,914 B2 | * | 11/2004 | Kim et al. ..................... 365/201 |
| 7,466,160 B2 | * | 12/2008 | Ong et al. ...................... 324/765 |
| 2002/0194558 A1 | * | 12/2002 | Wang et al. ................... 714/718 |
| 2003/0226064 A1 | | 12/2003 | Nakazawa |
| 2008/0115024 A1 | * | 5/2008 | Wang et al. ................... 714/731 |

* cited by examiner

*Primary Examiner* — John P Trimmings

(74) *Attorney, Agent, or Firm* — Edell, Shapiro & Finnan, LLC

(57) ABSTRACT

Embodiments of the present invention include an apparatus to selectively provide information within a device to enable the device to perform a function. The apparatus comprises a generator unit to generate information for the device to perform the function, a receiver unit to receive information from a source and provide the received information for the device, and a storage unit. The storage unit selectively stores the information from the generator unit and the receiver unit for use by the device in accordance with an information selection signal and a mode signal indicating entry of the device into a particular device mode. Information from the receiver unit is stored in the storage unit in response to availability of information from the receiver unit and the mode signal indicating entry of the device into the particular device mode.

18 Claims, 6 Drawing Sheets

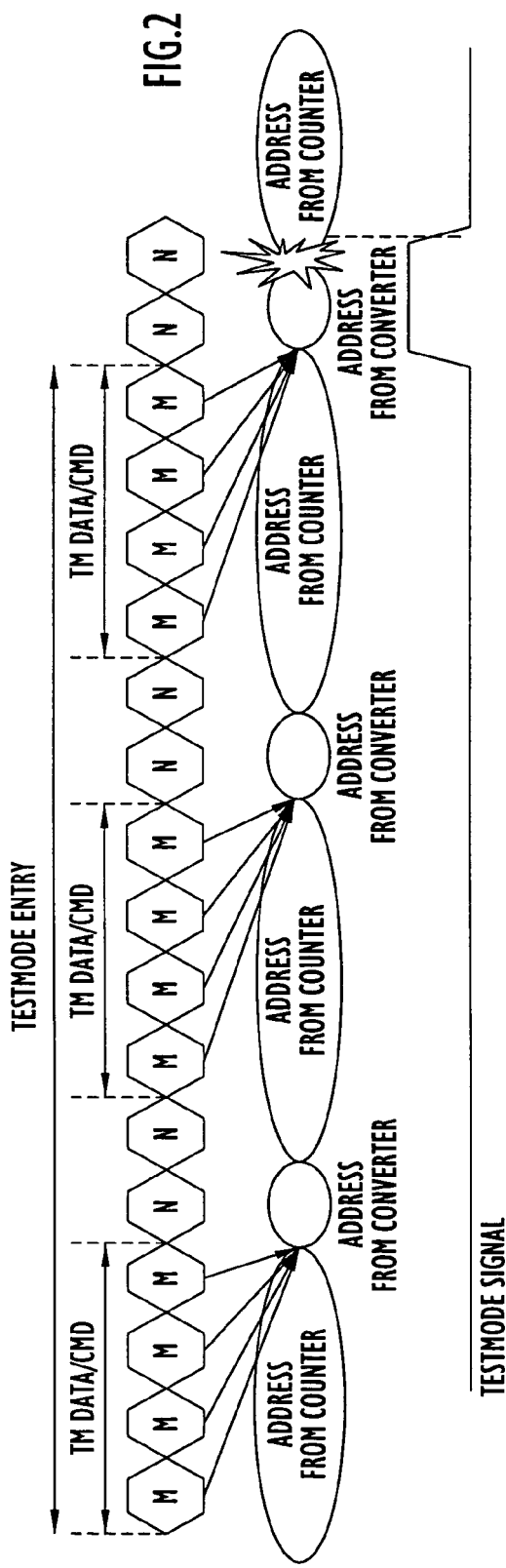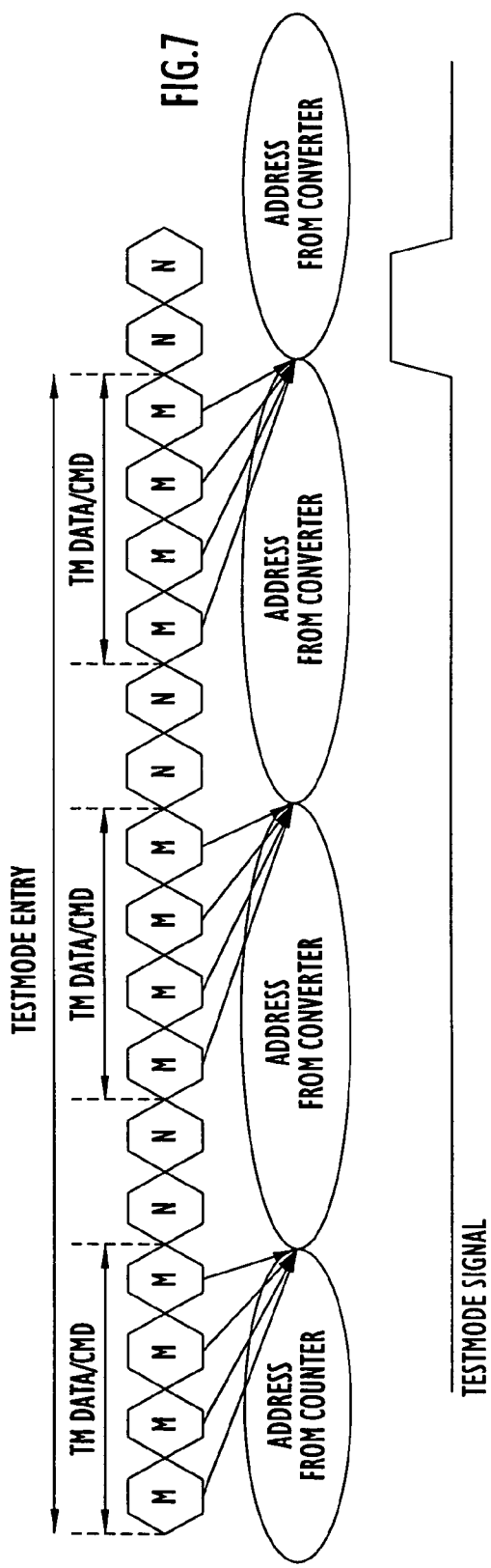

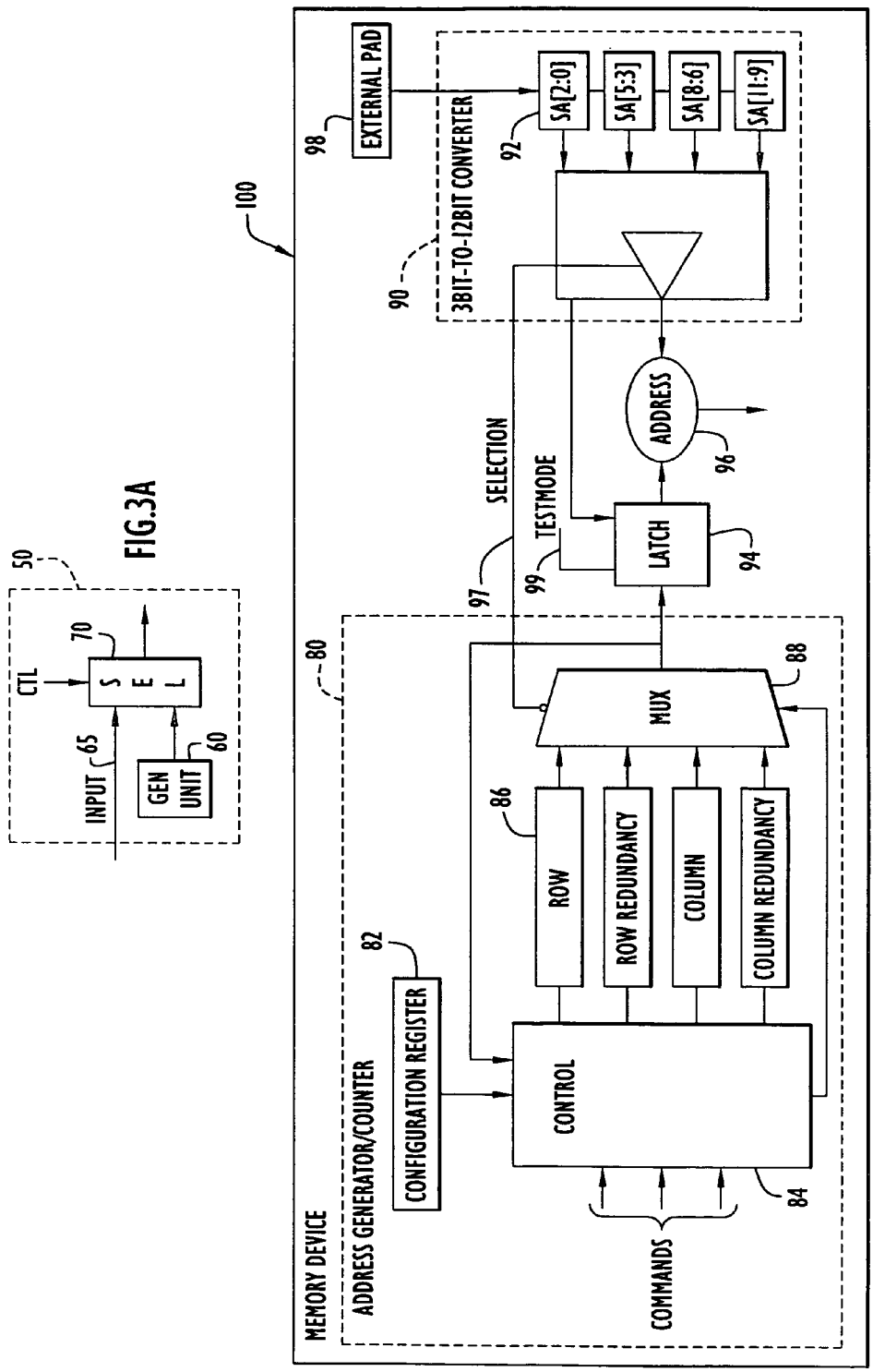

METHOD AND APPARATUS FOR SELECTIVELY UTILIZING INFORMATION WITHIN A SEMICONDUCTOR DEVICE

BACKGROUND

Various semiconductor or other devices may utilize internally generated data and/or data received from external sources to perform a variety of functions. For example, the devices may include memory devices with internal generator circuits that may be in the form of counters to internally generate data patterns or to internally generate addresses for accessing memory locations. However, these internal generator circuits may encounter timing issues with respect to operational and/or testing modes of the device.

For example, a memory device 12 may be coupled to a memory tester 10 as illustrated in FIG. 1. The memory tester generally tests several memory devices formed on a wafer. The memory device can be in the form of a Dynamic Random Access Memory (DRAM) and may internally generate addresses for the memory device in certain modes. Memory tester 10 typically provides signals to the memory device to perform various tests. These signals are provided to the memory device via a set of pads or pins (not shown), and may be associated with a clock, a command, an address and data. The memory device includes a pad circuit 14 and a compression circuit 16. The compression circuit compresses the received data and data from the memory.

The pad circuit receives address information on a reduced quantity of pads and produces an address for the memory device. The pad circuit may generate an address internally or utilize the address received from the memory tester via the pads. Since fewer pads are needed for each memory device, this configuration enables the memory tester to test a greater quantity of memory devices in parallel. By way of example, the pad circuit may utilize three pads to produce a desired twelve bit address. Since three address bits are received within a clock cycle (e.g., one address bit is received on each pad within a clock cycle), a full twelve bit address is produced after four clocks.

Referring to FIG. 2, once memory device 12 enters a test mode, test commands from memory tester 10 are received. Since an address provided by the memory tester is obtained in four clocks due to the reduced pad configuration, the internally generated addresses are utilized by the memory device during this interval (e.g., prior to the address being available from the address converter). Once four clock periods have expired, the address from the memory tester is utilized. After this period, the internally generated address is utilized until the next address from the memory tester is available (e.g., in four clock cycles).

The memory device should not revert from the externally supplied address to the internally generated address until a falling edge of a test mode signal (e.g., indicating use of the externally supplied address is complete). If the memory device prematurely reverts back to the internally generated address, the incorrect or inappropriate address for the memory device is accessed and the results of the test are corrupted. This may occur even though a proper address may be supplied from the memory tester. Further, utilization of a specific address in test mode may require issuance of several dummy operations that enable the internally generated address to be incremented or otherwise adjusted to the specific address, thereby introducing testing inefficiencies and wasting device resources. Similar scenarios may exist with respect to internally generated data or addresses within other devices.

SUMMARY OF THE INVENTION

Embodiments of the present invention include an apparatus to selectively provide information within a device to enable the device to perform a function. The apparatus comprises a generator unit to generate information for the device to perform the function, a receiver unit to receive information from a source and provide the received information for the device, and a storage unit. The storage unit selectively stores the information from the generator unit and the receiver unit for use by the device in accordance with an information selection signal and a mode signal indicating entry of the device into a particular device mode. Information from the receiver unit is stored in the storage unit in response to availability of information from the receiver unit and the mode signal indicating entry of the device into the particular device mode.

BRIEF DESCRIPTION OF THE DRAWINGS

The above and still further features and advantages of the present invention will become apparent upon consideration of the following detailed description of specific embodiments thereof, particularly when taken in conjunction with the accompanying drawings wherein like reference numerals in the various figures are utilized to designate like components.

FIG. 2 is a timing diagram illustrating a sequence of test mode commands from a memory tester and utilization of an internally generated address and an externally supplied address.

FIG. 3A is a block diagram of a semiconductor device that selects internally generated or externally supplied information according to an embodiment of the present invention.

FIG. 4 is a schematic block diagram of a memory device configured to selectively utilize an internally generated address and an externally supplied address according to an embodiment of the present invention.

FIG. 7 is a timing diagram illustrating a sequence of test mode commands from a memory tester and utilization of an internally generated address and an externally supplied address according to embodiments of the present invention.

DETAILED DESCRIPTION

Various semiconductor or other devices may utilize internally generated data and/or data received from external sources to enable the device to perform varying functions. For example, the devices may be in the form of memory devices, processing devices and/or various circuitry, and include internal generator circuits that may be in the form of counters to internally generate data patterns or to internally generate addresses for accessing memory locations. However, these internal generator circuits may encounter timing issues with respect to operational and/or testing modes of the device, thereby enabling needed information (e.g., addresses, data, etc.) to become unavailable at desired times.

Figure 1:
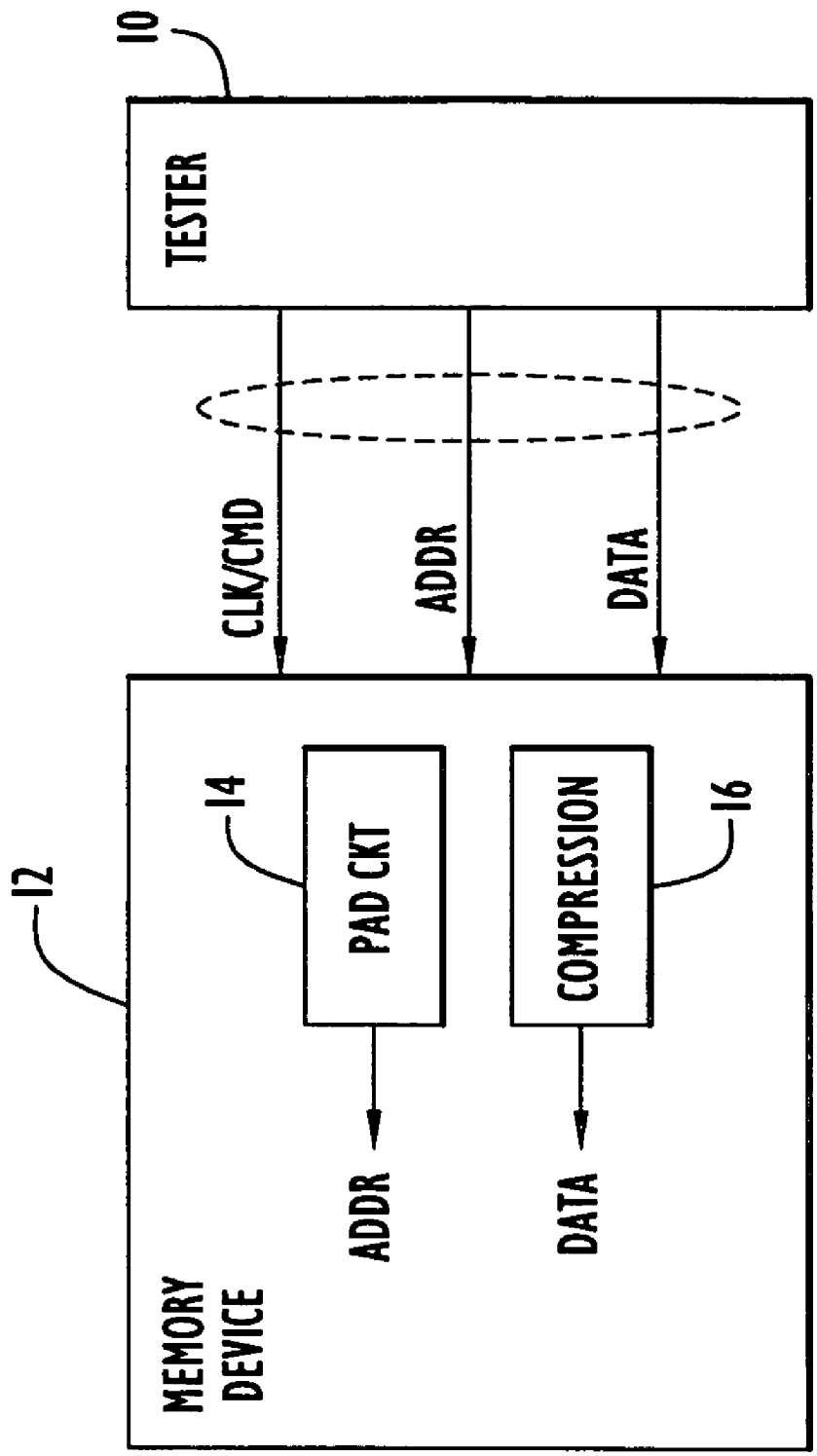
FIG. 1 is a block diagram of a memory device coupled to a memory tester.
Figure 3B:
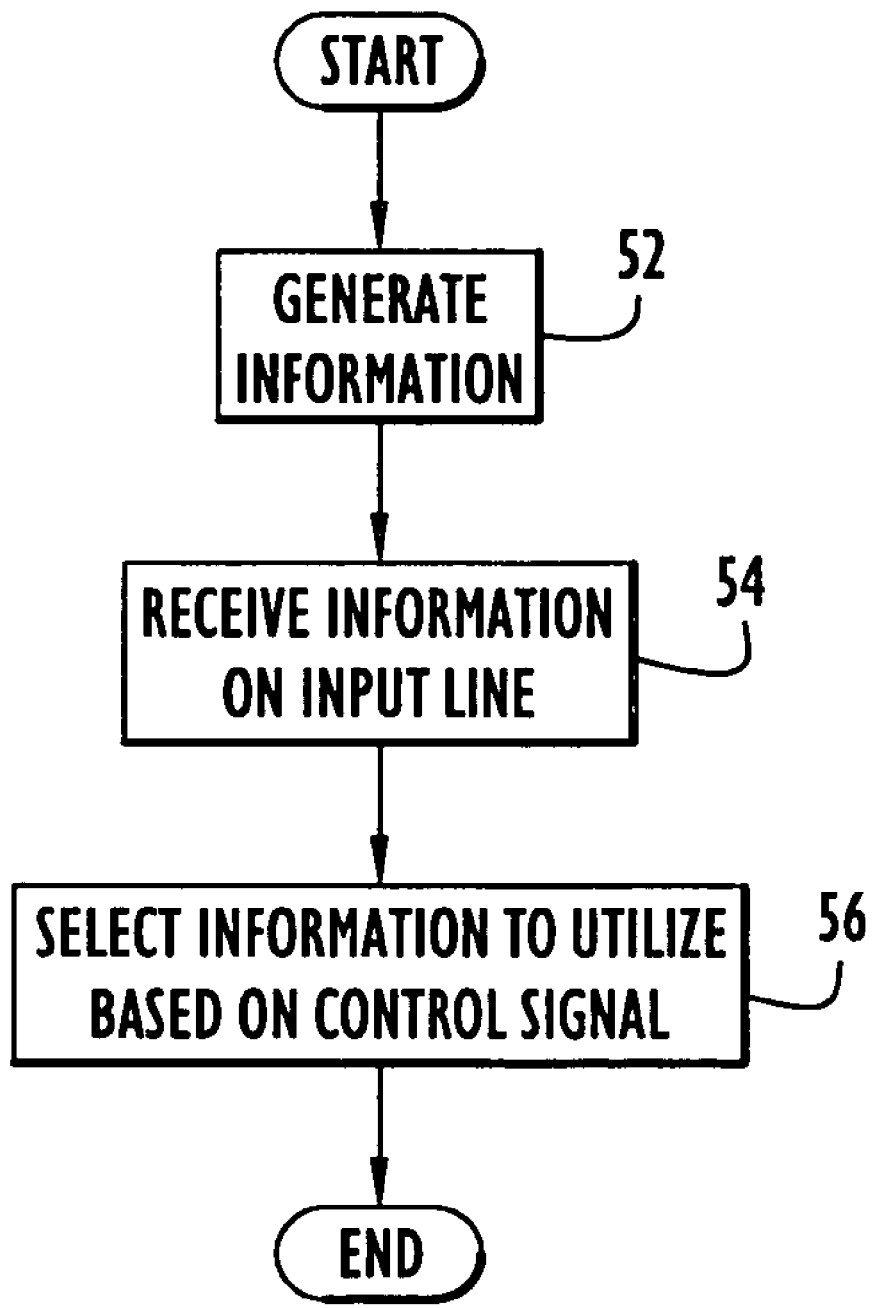
FIG. 3B is a flow chart illustrating the manner of selecting internally generated or externally supplied information according to an embodiment of the present invention.

The present invention embodiments enable devices to selectively utilize information from the generator circuits and from the external sources to avoid timing issues and enable information to be available when needed. An embodiment of the present invention is illustrated in FIGS. 3A-3B. Specifically, a device 50 includes a generator unit 60 and a selection unit 70. Device 50 may be any suitable device (e.g., semiconductor or memory device, processing device, circuitry, etc.). Generator unit 60 may be any suitable device (e.g., address generator, counter, data pattern or sequence generator, etc.) and generates information for use by device 50 (e.g., FIG. 3B, step 52). Device 50 receives externally supplied information on an input line 65 (e.g., FIG. 3B, step 54). For example, device 50 may be in the form of a memory device and receives information from an external test unit on input line 65.

Selection unit 70 is coupled to generator unit 60 and input line 65 and provides either the generated information from generator unit 60 or the externally supplied information on input line 65 for use by device 50 (e.g., FIG. 3B, step 56). The selection unit may be implemented by any suitable arrangements or devices (e.g., multiplexer, latch or buffer arrangements where selected data is overwritten within the latches or buffers, logic circuitry, etc.). The selection unit is controlled by a control signal directing the selection unit to provide the appropriate information or selection. The control signal may be derived from an existing signal within device 50 or be generated to produce the desired selection. For example, device 50 may utilize the generated information during normal modes of operation and utilize the externally supplied information during a test mode. In this case, the control signal may be in the form of or be logically derived from a test mode signal to enable selection of the externally supplied information during testing of the device.

An exemplary embodiment of the present invention with respect to a memory device is illustrated in FIG. 4. Specifically, a memory device 100 includes an address generator 80 and an address converter 90. By way of example only, memory device 100 is implemented by a Dynamic Random Access Memory (DRAM), but may be any suitable memory device. The memory device may be coupled to a memory tester in a similar manner as described above to receive signals to perform various tests. These signals are provided to the memory device via a set of pads or pins. The address generator and address converter reduce the number of tester pins or pads needed to provide an address for testing the memory device. This enables the memory tester to test a greater quantity of memory devices in parallel.

Address converter 90 includes a series of registers 92 and receives address information from a reduced quantity of pads 98 (e.g., the quantity of pads utilized is less than the quantity of bits within the address). The received information from pads 98 are stored in registers 92 to produce an address for the memory device. By way of example, the address converter utilizes three pads to receive address information (e.g., a twelve bit address) from the memory tester (e.g., via a Mode Register Set (MRS) or other command) and produce the desired twelve bit address for the memory device. Since three address bits are received within a clock cycle (e.g., one address bit on each pad within a clock cycle), a full twelve bit address for memory device 100 is produced by the address converter after four clock cycles (e.g., four MRS or other commands).

Address generator 80 produces an address for the memory device internally and includes a configuration register 82, a controller 84, a series of counters 86 and a selector or multiplexer 88. Controller 84 receives memory device commands (e.g., Read/Write, Activate, etc.) and is coupled to configuration register 82, counters 86 and multiplexer 88. The counters respectively maintain counts or addresses for rows (e.g., row and row redundancy as viewed in FIG. 4) and columns (e.g., column and column redundancy as viewed in FIG. 4) within memory. The counters are controlled by controller 84 in accordance with parameters stored within configuration register 82 and generate row and column memory addresses internally (e.g., based on an externally supplied address from the memory tester). Depending upon the command issued, controller 84 controls multiplexer 88 to select the appropriate counter output or address for use by the memory device in accordance with parameters stored within configuration register 82. A selection signal 97 is further employed to control multiplexer 88 and address converter 90 to selectively provide their output to an address register 96. The selection signal basically enables either the multiplexer or address converter (while disabling the other) to provide an address within the address register (e.g., a low level signal indicates multiplexer 88, while a high level signal indicates address converter 90). The selection signal may be generated by controller 84, other memory device unit or the memory tester, or may be derived from another signal utilized by the memory device.

Once memory device 100 enters a test mode, test commands (e.g., MRS or other commands including an address portion) from the memory tester are received. Since an address provided by the memory tester is obtained in four clock cycles due to the reduced pad configuration as described above, addresses for the memory device during this interval (e.g., prior to the address being available from the address converter) are supplied from the address generator. Once four clock cycles have expired, the address from the memory tester (e.g., from the MRS or other commands) is supplied from the address converter to address register 96 in the next clock cycle. After this period, the address is supplied from the internal generator until the next address from the memory tester is available from the address converter. This sequence of operation is performed in accordance with selection signal 97.

The memory device should not revert back from the address converter to the address generator until a falling edge of a test signal (e.g., indicating use of the externally supplied address is complete) since the address generator may be in a state that fails to produce a proper address, thereby corrupting the results of the test. Accordingly, a latch 94 is disposed between multiplexer 88 and address register 96 to ensure that the address from the address converter is utilized during test mode. The latch is coupled to an output of multiplexer 88 and receives the address selected by the multiplexer. Latch 94 is further coupled to address converter 90 and is controlled by a test mode signal 99. The test mode signal indicates the occurrence of the memory device operating in a test mode and enables the address from the address converter to be stored within (and overwrite the contents of) latch 94. The test mode signal may be generated in response to the memory device receiving particular test mode commands (e.g., the test mode signal may enter a high or low level state in response to a Mode Register Set (MRS) or other command utilized to indicate entry into test mode and availability of the address from the address converter, and may be set to a complementary state in response to a test mode exit or other command utilized to indicate termination of test mode). The test mode signal may be generated and/or toggled by controller 84 or other circuitry (e.g., individual unit, etc.) within memory device 100. The contents of the latch are provided to address register 96 when the multiplexer is enabled by selection signal 97.

In operation, when memory device 100 enters a test mode (e.g., indicated by an MRS or other command), the memory device generates an appropriate test mode signal 99 indicating the occurrence of a test mode, and alternately enables multiplexer 88 and address converter 90 to provide an address to address register 96 in substantially the same manner described above. Initially, selection signal 97 enables multiplexer 88 during the interval prior to the initial address being available from the address converter. The resulting address from the multiplexer is stored in latch 94. Once the address from the address converter becomes available (e.g., after four clock cycles as described above), selection signal 97 enables the address converter output and disables multiplexer 88 to enable the address from the address converter to be placed in address register 96 as described above. When the memory device subsequently reverts back to multiplexer 88 for an address, the address from the multiplexer is stored in latch 94 as described above. However, test mode signal 99 (indicating the occurrence of a test mode) enables the latch to receive the address from the address converter, thereby overwriting the address from the multiplexer. The address from the address converter is subsequently placed in address register 96.

Thus, even though multiplexer 88 is enabled during test mode, address register 96 always receives the address from the address converter in this mode once the initial address is available from the address converter as illustrated in FIG. 7. This ensures proper timing (e.g., prevents premature switching between the address generator and address converter during a test mode signal) and that appropriate addresses are available when needed. In addition, a specific address may be directly provided to the memory device (e.g., via a command) from an external source (e.g., memory tester) without employing dummy operations to increment or otherwise adjust addresses within the address generator to attain the specific address.

Figure 5:
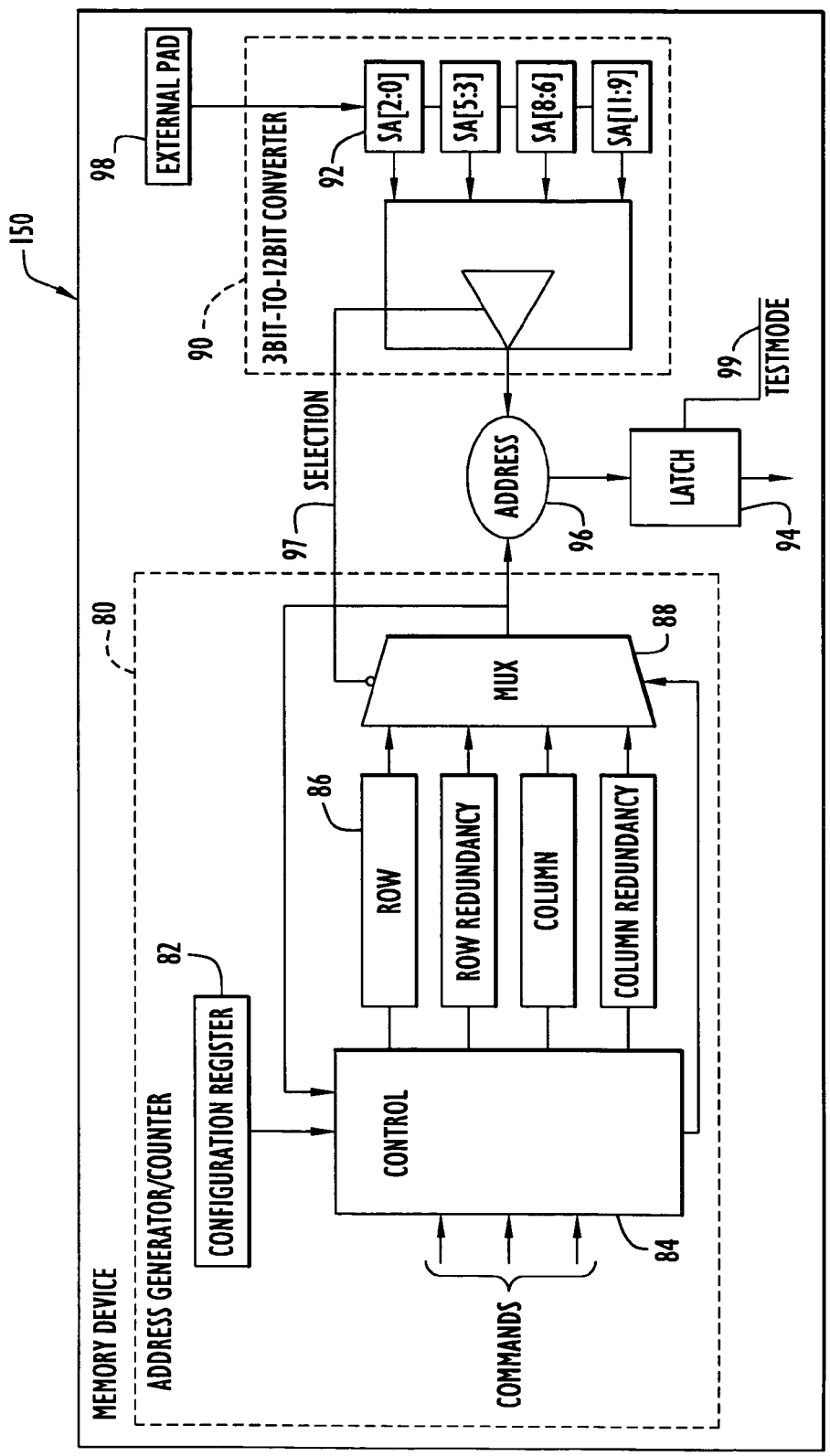
FIG. 5 is a schematic block diagram of a memory device configured to selectively utilize an internally generated address and an externally supplied address according to an alternative embodiment of the present invention.

An alternative embodiment of the present invention is illustrated in FIG. 5. This embodiment is similar to the embodiment described above for FIG. 4 and includes latch 94 coupled to an output of address register 96. Specifically, memory device 150 includes address generator 80, address converter 90, latch 94 and address register 96, each substantially similar to the corresponding components described above. Address generator 80 produces an address for the memory device internally and includes configuration register 82, controller 84, counters 86 and selector or multiplexer 88 arranged as described above. Address converter 90 includes registers 92 and receives address information from a reduced quantity of pads 98 as described above. The received information from pads 98 is stored in registers 92 to produce an address for the memory device as described above.

Multiplexer 88 and address converter 90 are directly coupled to address register 96 and provide corresponding addresses to that register in accordance with selection signal 97 (e.g., a low level signal indicates multiplexer 88, while a high level signal indicates the address converter) as described above. Latch 94 is coupled to an output of address register 96 and receives the address stored in that register. Latch 94 is further coupled to address converter 90 and is controlled by test mode signal 99. The test mode signal may be generated in response to the memory device receiving particular test mode commands (e.g., the test mode signal may enter a high or low level state in response to a Mode Register Set (MRS) or other command indicating entry into test mode, and may be set to a complementary state in response to a test mode exit or other command indicating termination of test mode) as described above. The test mode signal may be generated and/or toggled by controller 84 or other circuitry (e.g., individual unit, etc.) within memory device 150. The address stored in the latch is subsequently utilized by the memory device.

In operation, when memory device 150 enters a test mode (e.g., indicated by an MRS or other command), the memory device generates an appropriate test mode signal 99 indicating the occurrence of a test mode, and alternately enables multiplexer 88 and address converter 90 to provide an address to address register 96 in substantially the same manner described above. Initially, selection signal 97 enables multiplexer 88 during the interval prior to the initial address being available from the address converter. The resulting address from the multiplexer is stored in address register 96 and subsequently in latch 94 for use by the memory device. Once the address from the address converter becomes available (e.g., after four clock cycles as described above), selection signal 97 enables the address converter output and disables multiplexer 88 to enable the address from the address converter to be placed in address register 96 and subsequently latch 94 as described above. When the memory device subsequently reverts back to multiplexer 88 for an address, the address from the multiplexer is stored in address register 96 and subsequently latch 94 as described above. However, test mode signal 99 (indicating the occurrence of a test mode) enables the latch to receive the address from the address converter, thereby overwriting the address from the multiplexer. The address from the latch (in this case the address from the address converter) is subsequently utilized by the memory device.

Thus, even though multiplexer 88 is enabled during test mode, the memory device always utilizes the address from the address converter in this mode once the initial address is available from the address converter as illustrated in FIG. 7. This ensures proper timing (e.g., prevents premature switching between the address generator and address converter during a test mode signal) and that appropriate addresses are available when needed. In addition, a specific address may be directly provided to the memory device (e.g., via a command) from an external source (e.g., memory tester) without employing dummy operations to increment or otherwise adjust addresses within the address generator to attain the specific address.

Figure 6:
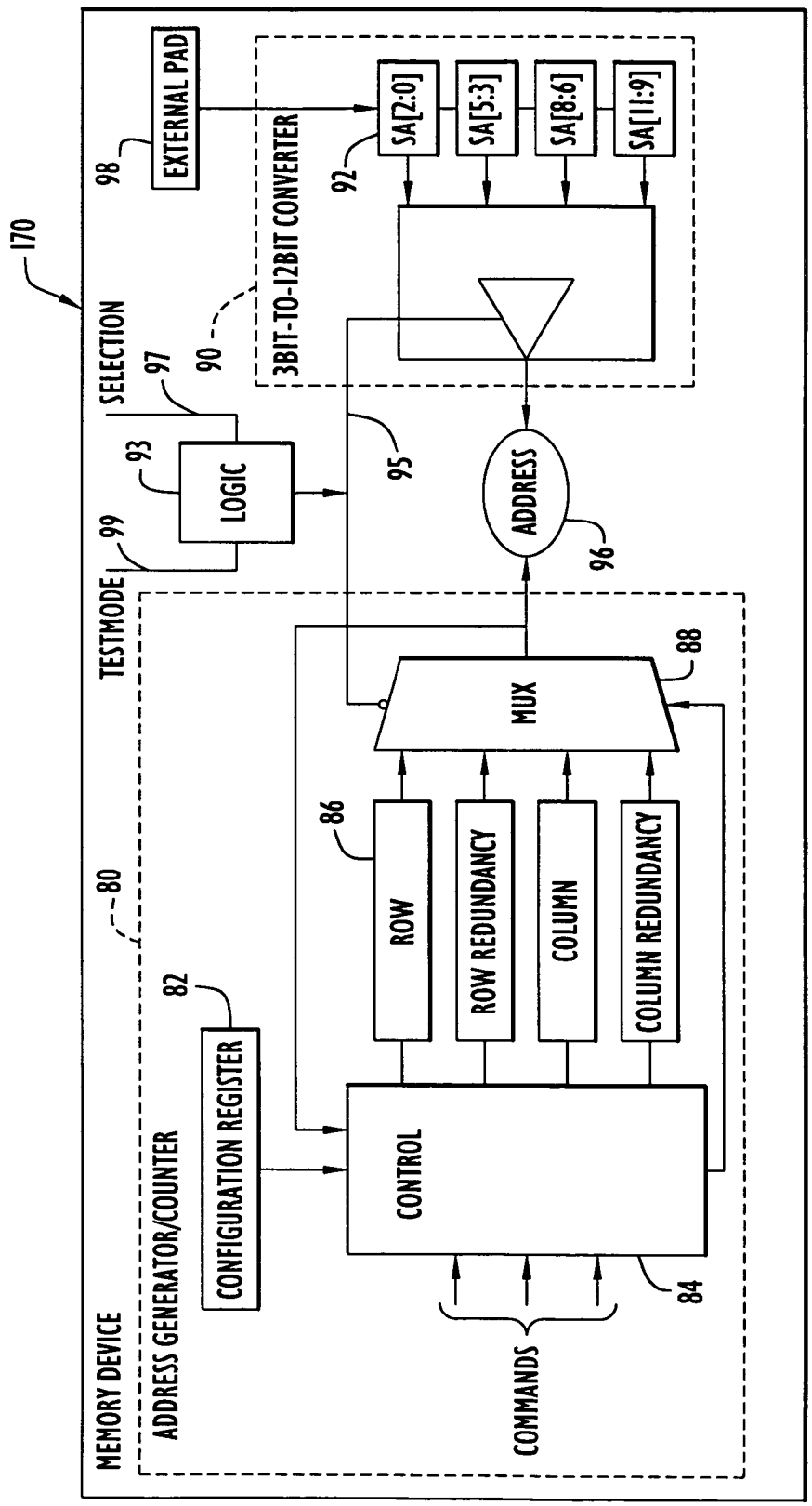
FIG. 6 is a schematic block diagram of a memory device configured to selectively utilize an internally generated address and an externally supplied address according to another embodiment of the present invention.

Another embodiment of the present invention is illustrated in FIG. 6. This embodiment is similar to the embodiments described above for FIGS. 4-5, and includes logic circuitry 93 to derive a control signal 95 from selection and test mode signals 97, 99. Specifically, memory device 170 includes address generator 80, address converter 90 and address register 96, each substantially similar to the corresponding components described above. Address generator 80 produces an address for the memory device internally and includes configuration register 82, controller 84, counters 86 and selector or multiplexer 88 arranged as described above. Address converter 90 includes registers 92 and receives address information from a reduced quantity of pads 98 as described above. The received information from pads 98 is stored in registers 92 to produce an address for the memory device as described above.

Multiplexer 88 and address converter 90 are directly coupled to address register 96 and provide corresponding addresses to that register in accordance with control signal 95 derived from selection and test mode signals 97, 99. Test mode signal 99 indicates the occurrence of the memory device in a test mode as described above, while selection signal 97 designates either the multiplexer or address converter (while disabling the other) to provide an address within the address register (e.g., a low level signal indicates multiplexer 88, while a high level signal indicates address converter 90) as described above.

Memory device 170 further includes logic circuitry 93 that receives selection and test mode signals 97, 99 and produces control signal 95. Control signal 95 basically enables either the multiplexer or address converter (while disabling the other) to provide an address within the address register for use by the memory device (e.g., a low level signal indicates multiplexer 88, while a high level signal indicates address converter 90), where the address converter provides the address while the memory device is in a test mode as described below. The logic circuitry may be implemented by any suitable logic circuitry (e.g., gates, chips, etc.) providing any logic function to combine the signals (e.g., OR, AND, NOR, XOR, etc.). By way of example only, logic circuitry 93 implements a logic OR function. Basically, when memory device 170 enters a test mode (e.g., indicated by an MRS or other command), selection signal 97 alternately indicates multiplexer 88 and address converter 90 to provide the address as described above (e.g., a low level signal indicates multiplexer 88, while a high level signal indicates the address converter). However, test mode signal 99 indicates the occurrence of the test mode entry, and preferably includes a high level signal. Logic circuitry 93 combines selection and test mode signals 97, 99 to produce control signal 95. The control signal is in a high level state when either or both of the selection and test mode signals are in a high level state. Thus, when the memory device is in a test mode, test mode signal 99 is in a high level state, thereby enabling logic circuitry 93 to produce control signal 95 in a high level state. This enables address converter 90 to provide the address to address register 96 for use by the memory device.

In operation, when memory device 170 enters a test mode (e.g., indicated by an MRS or other command), selection signal 97 alternately designates multiplexer 88 and address converter 90 to provide an address as described above. Further, selection and test mode signals 97, 99 (e.g., each in a low level state) initially enable logic circuitry 93 to produce control signal 95 that enables multiplexer 88 during the interval prior to the initial address being available from the address converter. The resulting address from the multiplexer is stored in address register 96 for use by the memory device. Once the address from the address converter becomes available (e.g., after four clock cycles as described above), the memory device generates an appropriate test mode signal 99 (e.g., a high level signal) indicating the occurrence of a test mode. Logic circuitry 93 logically combines (e.g., via an OR logic function) selection and test mode signals 97, 99 to produce control signal 95. Since test mode signal 99 is in a high level state indicating the occurrence of the test mode, logic circuitry 93 produces control signal 95 in a high level state that enables address converter 90 to provide an address to address register 96.

Thus, address register 96 always receives the address from the address converter in test mode once the initial address is available from the address converter as illustrated in FIG. 7. This ensures proper timing (e.g., prevents premature switching between the address generator and address converter during a test mode signal) and that appropriate addresses are available when needed. In addition, a specific address may be directly provided to the memory device (e.g., via a command) from an external source (e.g., memory tester) without employing dummy operations to increment or otherwise adjust addresses within the address generator to attain the specific address.

It will be appreciated that the embodiments described above and illustrated in the drawings represent only a few of the many ways of implementing a method and apparatus for selectively utilizing information within a semiconductor device.

The present invention embodiments may be employed with or within any suitable devices (e.g., memory devices, processing devices, semiconductor devices, circuitry, etc.). The memory devices of the present invention embodiments may be implemented by any type of memory device (e.g., DRAM, SRAM, etc.) including arrays with any quantity of rows and columns and any suitable storage capacity. The various signals utilized in the present invention embodiments (e.g., selection, control, test mode, etc.) may be of any quantity or type, may be generated in any fashion (e.g., derived from current device signals, generated by an external or internal device unit, etc.) and may include any suitable levels or states to accomplish desired control (e.g., a high or low level signal may enable or disable the multiplexer or indicate a test or other mode, etc.). The test mode signal may be generated or set to indicate use of the address from the address converter in response to any suitable conditions (e.g., certain commands, subsequent any predetermined interval after a command to ensure availability of the address from the address converter, etc.).

The present invention embodiments may be utilized to select any desired information (e.g., addresses, data, etc.). The information may be generated internally via any suitable devices (e.g., address generators, data generators, counters, shift registers, etc.). The present invention embodiments may select between any quantities of internally generated or externally supplied data. The data may be supplied from any suitable external devices (e.g., test unit, control device, etc.). Alternatively, the present invention embodiments may select information from any internal and/or external sources (e.g., pre-stored or hard coded in the device, external devices, internally generated, etc.).

The generator unit may be implemented by any quantity of any conventional or other device generating addresses or data (e.g., an address generator or counter, data pattern or sequence generator, etc.). The generated information may include any quantity of bits. The selection unit may be implemented by any quantity of any conventional or other selection devices (e.g., multiplexer, latch or buffer arrangements where selected data is overwritten within the latches or buffers, logic circuitry, etc.). The selection unit may be controlled by any quantity of an type of suitable control signal including any desired states or values (e.g., a low or high level).

The address converter may utilize any quantity of pads or other input terminals or lines to receive information from an external device. Any quantity of bits of the address or other data may be supplied by the pads during a clock cycle. The pads may be of any quantity and may be implemented by any conventional or other pads, terminals, pins or other lines suitable to receive information. The address converter components may be implemented by any quantity of any conventional or other components (e.g., registers, etc.) arranged or configured to receive the information bits and provide a corresponding device address. Further, device addresses or data may include any quantity of bits. The address converter output may be enabled by any quantity of any type of control signal including any suitable value (e.g., a high or low level signal). The address converter may include any quantity of any conventional or other types of registers or storage units to store received information. The information may be received in any suitable order and stored in the registers in any fashion. The registers may include any suitable storage capacity.

The address generator components may include any quantity of any conventional or other components (e.g., counters, registers, multiplexer, etc.) to generate an address or other data pattern. The generated information may include any quantity of bits. The address generator may include any quantity of any type of conventional counter or other device maintaining and/or adjusting an address. The addresses maintained by the counters may be associated with any suitable memory locations (e.g., row, column, bank, etc.). The controller may be implemented by any conventional or other controller (e.g., processor, etc.) or circuitry to control address generator operation. The configuration and address registers may be of any quantity and may be implemented by any suitable registers or storage units including any desired storage capacity. The configuration register may store any suitable parameters.

The multiplexer may be implemented by any quantity of any conventional or other selection devices (e.g., multiplexer, gates, processor, etc.). The multiplexer may be controlled (e.g., selection, output, etc.) by any quantity of an type of suitable control signal including any desired states or values (e.g., a low or high level). The latch may be implemented by any quantity of any conventional or other latches or storage devices (e.g., latch, register, buffer, etc.). The latch may be controlled (e.g., input, output, etc.) by any quantity of any type of suitable control signal including any desired states or values (e.g., a low or high level). The latch may be disposed in any suitable location enabling the externally supplied or other data to be provided.

The logic circuitry may be of any quantity and may be implemented by any suitable logic or circuitry (e.g., gates, chips, etc.) providing any logic function (e.g., OR, AND, NOR, XOR, etc.) to combine any quantity of any type of signals (e.g., low or high level, etc.) to provide the desired selection or control. The logic circuitry may be disposed within the present invention embodiments in any suitable location and combine any desired signals to provide the desired control.

Embodiments of the present invention may be utilized to selectively provide any internally generated or other data (e.g., pre-stored, externally supplied, etc.) in response to any desired conditions. For example, the selection may be based on control signals generated in accordance with specific timing of a device, the presence or absence of certain device states or modes, or the states of particular device signals. Any suitable commands and/or signals may be utilized to indicate any changes in device modes (e.g., entry, exit, transitions, etc.).

From the foregoing description, it will be appreciated that the invention makes available a novel method and apparatus for selectively utilizing information within a semiconductor device.

Having described preferred embodiments of a new and improved method and apparatus for selectively utilizing information within a semiconductor device, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An apparatus to selectively provide information within a device to enable the device to perform a function comprising:
   a generator unit to generate information for said device to perform said function, wherein said device includes a memory device and said generator unit generates said information including an address for said memory device;
   a receiver unit to receive information from a source and provide said received information for said device, wherein said receiver unit receives and formats said source information including an address for said memory device from an external test unit; and
   a storage unit to selectively store said information from said generator unit and said receiver unit for use by said device in accordance with an information selection signal and a mode signal indicating entry of said device into a particular device mode, wherein said particular device mode includes a test mode and said storage unit stores said information from said receiver unit in response to availability of information from said receiver unit and said mode signal indicating entry of said device into said particular device mode.

2. The apparatus of claim 1, wherein:
   said memory device includes said generator unit, said receiver unit and said storage unit.

3. The apparatus of claim 1, wherein said storage unit includes a latch to selectively receive and store said information from said generator unit and said receiver unit for use by said device, wherein said latch overwrites information stored therein from said generator unit with information from said receiver unit in response to availability of information from said receiver unit and said mode signal indicating entry of said device into said particular device mode.

4. The apparatus of claim 1 further including:
   a latch coupled between said generator unit and said storage unit to receive and store said generated information and provide stored information to said storage unit, wherein said latch is further coupled to said receiver unit and overwrites information stored within said latch from said generator unit with information from said receiver unit in response to availability of information from said receiver unit and said mode signal indicating entry of said device into said particular device mode.

5. An apparatus to selectively provide information within a device to enable the device to perform a function comprising:
   a generator unit to generate information for said device to perform said function;
   a receiver unit to receive information from a source and provide said received information for said device;
   a storage unit to selectively store said information from said generator unit and said receiver unit for use by said device in accordance with an information selection signal and a mode signal indicating entry of said device into a particular device mode, wherein said storage unit stores said information from said receiver unit in response to availability of information from said receiver unit and said mode signal indicating entry of said device into said particular device mode; and
   a logic unit to logically combine said information selection signal and said mode signal to produce a control signal, wherein said control signal controls said outputs of said generator unit and said receiver unit to selectively provide information to said storage unit for use by said device;
   wherein said logic unit is configured to produce said control signal to enable said storage unit to store said information from said receiver unit in response to availability of information from said receiver unit and said mode signal indicating entry of said device into said particular device mode.

6. An apparatus to selectively provide information within a device to enable the device to perform a function comprising:
generator means for generating information for said device to perform said function, wherein said device includes a memory device and said generator means generates said information including an address for said memory device;
receiver means for receiving information from a source and providing said received information for said device, wherein said receiver means receives and fog mats said source information including an address for said memory device from an external test unit; and
storage means for selectively storing said information from said generator means and said receiver means for use by said device in accordance with an information selection signal and a mode signal indicating entry of said device into a particular device mode, wherein said particular device mode includes a test mode and said storage means stores said information from said receiver means in response to availability of information from said receiver means and said mode signal indicating entry of said device into said particular device mode.

7. The apparatus of claim 6, wherein:
said memory device includes said generator means, said receiver means and said storage means.

8. The apparatus of claim 6, wherein said storage means includes latch means for selectively receiving and storing said information from said generator means and said receiver means for use by said device, wherein said latch means overwrites information stored therein from said generator means with information from said receiver means in response to availability of information from said receiver means and said mode signal indicating entry of said device into said particular device mode.

9. The apparatus of claim 6 further including:
latch means coupled between said generator means and said storage means for receiving and storing said generated information and providing stored information to said storage means, wherein said latch means is further coupled to said receiver means and overwrites information stored within said latch means from said generator means with information from said receiver means in response to availability of information from said receiver means and said mode signal indicating entry of said device into said particular device mode.

10. An apparatus to selectively provide information within a device to enable the device to perform a function comprising:
generator means for generating information for said device to perform said function;
receiver means for receiving information from a source and providing said received information for said device;
storage means for selectively storing said information from said generator means and said receiver means for use by said device in accordance with an information selection signal and a mode signal indicating entry of said device into a particular device mode, wherein said storage means stores said information from said receiver means in response to availability of information from said receiver means and said mode signal indicating entry of said device into said particular device mode; and
logic means for logically combining said information selection signal and said mode signal to produce a control signal, wherein said control signal controls said outputs of said generator means and said receiver means to selectively provide information to said storage means for use by said device;
wherein said logic means is configured to produce said control signal to enable said storage means to store said information from said receiver means in response to availability of information from said receiver means and said mode signal indicating entry of said device into said particular device mode.

11. A method of selectively providing information within a device to enable the device to perform a function comprising:
(a) generating information for said device to perform said function, wherein said device includes a memory device and said generated information includes an address for said memory device;
(b) receiving information from a source and providing said received information for said device, wherein said source information includes an address for said memory device from an external test unit; and
(c) selectively storing said generated information and said received information within a storage unit for use by said device in accordance with an information selection signal and a mode signal indicating entry of said device into a particular device mode, wherein said particular device mode includes a test mode and said storage unit stores said received information in response to availability of said received information and said mode signal indicating entry of said device into said particular device mode.

12. The method of claim 11, wherein said storage unit includes a latch to selectively receive and store said generated information and said received information, and step (c) further includes:
(c.1) overwriting said generated information stored within said latch with said received information in response to availability of said received information and said mode signal indicating entry of said device into said particular device mode.

13. The method of claim 11, wherein a latch is coupled to said storage unit to receive and store said generated information and provide stored information to said storage unit, and step (c) further includes:
(c.1) overwriting said generated information stored within said latch with said received information in response to availability of said received information and said mode signal indicating entry of said device into said particular device mode.

14. A method of selectively providing information within a device to enable the device to perform a function comprising:
(a) generating information for said device to perform said function;
(b) receiving information from a source and providing said received information for said device; and
(c) selectively storing said generated information and said received information within a storage unit for use by said device in accordance with an information selection signal and a mode signal indicating entry of said device into a particular device mode, wherein said storage unit stores said received information in response to availability of said received information and said mode signal indicating entry of said device into said particular device mode, wherein step (c) further includes:
(c.1) logically combining said information selection signal and said mode signal to produce a control signal, wherein said control signal controls said storage unit to selectively store information for use by said device and enables said storage unit to store said received information in response to availability of said received information and said mode signal indicating entry of said device into said particular device mode.

15. A memory device to selectively utilize information to perform a function comprising:
- an address generator to generate an address for said memory device to perform said function;
- a converter to receive an address from a source including an external test unit and provide said received address in a particular format; and
- a storage unit to selectively store said addresses from said address generator and said converter for use by said device in accordance with an information selection signal and a mode signal indicating entry of said memory device into a particular memory device mode, wherein said particular device mode includes a test mode and said storage unit stores said address from said converter in response to availability of a formatted address from said converter and said mode signal indicating entry of said memory device into said particular memory device mode.

16. The memory device of claim 15, wherein said storage unit includes a latch to selectively receive and store said addresses from said address generator and said converter for use by said device, wherein said latch overwrites an address stored therein from said address generator with said formatted address from said converter in response to availability of a formatted address from said converter and said mode signal indicating entry of said memory device into said particular memory device mode.

17. The memory device of claim 15 further including:
- a latch coupled between said address generator and said storage unit to receive and store said generated address and provide a stored address to said storage unit, wherein said latch is further coupled to said converter and overwrites an address stored within said latch from said address generator with a formatted address from said converter in response to availability of said formatted address from said converter and said mode signal indicating entry of said memory device into said particular memory device mode.

18. A memory device to selectively utilize information to perform a function comprising:
- an address generator to generate an address for said memory device to perform said function;
- a converter to receive an address from a source and provide said received address in a particular format;
- a storage unit to selectively store said addresses from said address generator and said converter for use by said device in accordance with an information selection signal and a mode signal indicating entry of said memory device into a particular memory device mode, wherein said storage unit stores said information from said converter in response to availability of formatted information from said converter and said mode signal indicating entry of said memory device into said particular memory device mode; and
- a logic unit to logically combine said information selection signal and said mode signal to produce a control signal, wherein said control signal controls said outputs of said address generator and said converter to selectively provide an address to said storage unit for use by said device;
- wherein said logic unit is configured to produce said control signal to enable said storage unit to store said address from said converter in response to availability of a formatted address from said converter and said mode signal indicating entry of said memory device into said particular memory device mode.

* * * * *